(12) United States Patent
Roddy et al.

(10) Patent No.: US 6,999,838 B2
(45) Date of Patent: *Feb. 14, 2006

(54) SYSTEM AND METHOD FOR IMPROVING LASER POWER AND STABILIZATION USING HIGH DUTY CYCLE RADIO FREQUENCY INJECTION

(75) Inventors: James E. Roddy, Rochester, NY (US); William R. Markis, Spencerport, NY (US)

(73) Assignee: Eastman Kodak Company, Rochester, NY (US)

( * ) Notice: Subject to any disclaimer, the term of this patent is extended or adjusted under 35 U.S.C. 154(b) by 346 days.

This patent is subject to a terminal disclaimer.

(21) Appl. No.: 10/337,691

(22) Filed: Jan. 7, 2003

(65) Prior Publication Data

US 2003/0128725 A1 Jul. 10, 2003

Related U.S. Application Data

(63) Continuation-in-part of application No. 09/788,747, filed on Feb. 20, 2001, now abandoned.

(51) Int. Cl.
*H01S 3/10* (2006.01)

(52) U.S. Cl. ....................... 700/166; 250/205
(58) Field of Classification Search ................ 700/166; 372/29.021, 29.015, 29.012; 250/205
See application file for complete search history.

(56) References Cited

U.S. PATENT DOCUMENTS

| | | | | |
|---|---|---|---|---|
| 4,972,425 A | * | 11/1990 | Braski | 372/32 |
| 5,077,748 A | * | 12/1991 | Kozlovsky et al. | 372/22 |
| 5,175,722 A | | 12/1992 | Minami et al. | |
| 5,197,059 A | | 3/1993 | Minami et al. | |
| 5,386,409 A | | 1/1995 | Yokota et al. | |
| 5,422,900 A | | 6/1995 | Reele et al. | |
| 5,495,464 A | | 2/1996 | Fujikawa et al. | |
| 5,809,049 A | * | 9/1998 | Schaefer et al. | 372/38.02 |
| 5,970,078 A | * | 10/1999 | Walker | 372/38.01 |
| 6,049,073 A | * | 4/2000 | Roddy et al. | 250/205 |
| 6,226,309 B1 | * | 5/2001 | Tsubota | 372/46 |

* cited by examiner

*Primary Examiner*—Albert W. Paladini
(74) *Attorney, Agent, or Firm*—Nelson Adrian Blish

(57) ABSTRACT

A system and method of stabilizing laser output levels includes a laser (10), an injection circuit for injecting a radio frequency waveform, and a control circuit for energizing and stabilizing the laser. The radio frequency waveform injected by the injection circuit has a high duty cycle to maintain high output power while providing a stable multimode spectrum. A back facet photodiode sensor (102) detects radiation emitted from a back facet semiconductor laser (101) and provides a feedback signal to the control circuit (41) for maintaining the laser output power. The response of the photodiode is not fast enough to track intensity variations due to the RF waveform, and thus provides feedback to the control circuit (41) only when there is a substantial need to adjust laser power.

16 Claims, 7 Drawing Sheets

SYSTEM AND METHOD FOR IMPROVING LASER POWER AND STABILIZATION USING HIGH DUTY CYCLE RADIO FREQUENCY INJECTION

CROSS REFERENCE TO RELATED APPLICATIONS

This is a Continuation-in-Part of U.S. patent application Ser. No. 09/788,747, filed Feb. 20, 2001 now abandoned, entitled SYSTEM AND METHOD FOR IMPROVING LASER POWER AND STABILIZATION USING HIGH DUTY CYCLE RADIO FREQUENCY INJECTION, by Roddy et al.

FIELD OF THE INVENTION

This invention relates in general to stabilized semiconductor lasers for imaging applications and in particular, to a high duty cycle radio frequency waveform injected into a semiconductor laser with a back facet closed loop control circuit.

BACKGROUND OF THE INVENTION

In many imaging applications, it is often desirable to have an inexpensive semiconductor laser device that provides constant wavelength and power output, as well as low noise. In one type of laser raster printing system, a photosensitive media is placed on a drum and is written to by a semiconductor laser. A light beam from the laser is typically deflected from a polygon or galvanometer, and focused through an imaging lens. The image is written pixel by pixel using a raster scan technique onto a photosensitive media.

Controlling the amount of laser energy delivered is important in achieving quality images. Unwanted variations in laser energy delivered to a photosensitive media can introduce objectionable artifacts, such as dark and light streaks or spots in the image printed on the media. In many image writing applications, laser optical power must be controlled to better than 0.5% accuracy in order to obtain a reasonable image quality.

Optical power is affected by many parameters, such as semiconductor laser driving current and operating temperature. In order to ensure that a laser operates at a stable condition, an operating temperature is chosen in which the laser operates at a wavelength which is relatively constant. For example, assume a particular laser has a relatively stable operating wavelength of 685 nm only over a narrow temperature range of 3° C. Outside this range, there would be variations in intensity of the laser output power as the laser hops from one mode to another. A thermoelectric cooler must be used to keep the laser in its stable range of operation.

Another problem which may cause variations in laser power output is caused by optical feedback, which is unwanted light reflected back into a laser by optical elements external to the laser. Optical feedback can disturb laser operation and cause intensity fluctuations which may amount to as much as 10% or 20%. As more components are added, such as in a collimator lens and beam forming optics, the stable temperature range in which the laser can operate may be decreased significantly from the 3° C. noted above, to only a few tenths of a degree.

Other factors may affect the stability of laser operating systems. For example, characteristics of some components change with age, and small contaminants may accumulate on the surfaces of the optical elements. This change can cause variations in reflectivity which results in optical feedback to the laser.

Past attempts to stabilize laser performance have met with mixed results. For example, thermoelectric coolers have been used to prevent drift with ambient temperature. However, over the operating life of the equipment, lasers still may change modes because laser characteristic changes or external optical elements shift, causing optical feedback. Furthermore, thermoelectric coolers add additional cost and complexity.

Another method of stabilizing laser is using back facet photosensors which detect a portion of the light leaving a back facet of the laser to control laser output. This has not been entirely successful because the layers of dielectric mirror coating on the back facet of the laser are wavelength specific. Therefore, small changes in the wavelength of the light leaving the back facet can result in large changes in power to the back facet sensor, while the actual laser output is essentially unchanged. The power control loop on the laser ends up making a light level correction where none should be made.

Another attempt at stabilization of lasers has used radio frequencies (RF) to stabilize low power level lasers, for example, laser printing in the range of 1 to 2 mW. These low power RF stabilization schemes, however, are not suitable for high power laser stabilization because of intensity control problems. This type of RF stabilization in a high power laser has a possibility of back-biasing the laser diode and destroying it. See U.S. Pat. Nos. 5,197,059; 5,386,409; and 5,495,464. Other undesirable features in RF control are decreased lifetime and overdriving of the laser. See U.S. Pat. Nos. 5,495,464 and 5,175,722.

A further attempt at stabilization of low power lasers has used radio frequencies with low duty cycle waveforms. U.S. Pat. No. 5,386,409 discloses the use of low duty cycle radio frequency waveform to stabilize a semiconductor laser for reading and writing to an optical disk.

In addition, attempts have been made to stabilize high power semiconductor lasers at approximately 20 to 100 mW using RF injection. U.S. Pat. No. 6,049,073 discloses a system and method for high power semiconductor laser stabilization using RF injection, where the RF waveform is a sine wave. This method of stabilization, however, only allows half the laser's rated output power to be available as stabilized power because 50% duty cycle sine wave is used as the RF drive. Driving the laser at higher current levels to increase power results in overdriving the laser and decreasing lifetime. Increasing the RF drive to the laser can result in back biasing the laser and destroying it.

It is, therefore, desirable to stabilize a high power semiconductor laser at or near its rated maximum power against changes in temperature, current variations, effects of aging, and optical feedback.

SUMMARY OF THE INVENTION

It is an object of the present invention to provide a high power output radio frequency injected stabilized semiconductor laser. It is another object of the invention to provide a laser with a stable spectrum output that allows for accurate back facet photodiode control. It is a further object of this invention to eliminate the need for thermoelectric cooling to control the output of the laser. It is an additional object of the invention to confine any inherent laser noise within each pixel of an image when the stabilized semiconductor laser is used as part of a raster scan image writing system, thus rendering the resultant spatial noise invisible to the eye.

The present invention is directed to overcoming one or more of the problems set forth above. According to one aspect of the present invention, a system for stabilizing laser output levels comprises a laser responsive to a control signal for generating a radiation beam. A control circuit connects to the laser providing the control signal to the laser. An injection circuit connects to the output of the control circuit injecting a high duty cycle radio frequency waveform into the laser. A back facet photodiode sensor detects radiation from a back facet of the laser and provides a feedback signal to the control circuit to maintain a power level of the laser constant. A radio frequency waveform causes the laser to oscillate above and below a DC bias point between the levels of a lasing threshold level and an asymmetrical level above a DC bias point. An injection circuit injects the radio frequency waveform with a duty cycle greater than 50%.

According to one embodiment of the present invention a radio frequency signal is injected into a semiconductor laser, wherein the waveform has a duty cycle greater than 50%. A control circuit connected to the laser provides the control signal and an injection circuit injects a radio frequency signal into the laser. A back facet photodiode sensor detects radiation emitted from a back facet of the laser diode and provides a feedback signal to the control circuit for adjusting laser output power.

The advantage of injecting a radio frequency waveform with a high duty cycle into a semiconductor laser is that the laser will have both high output power and stability without exceeding the maximum rated parameters of current or power. For example, a 50 mW laser with an RF waveform with a 90% duty cycle will allow 45 mW of stabilized power without driving the current above $I_{op}$, the maximum rated current. In order to achieve high power, the laser is operated predominantly above laser threshold, and will only operate near the lasing threshold for short intervals of the duty cycle.

To achieve stability, the injection of the radio frequency waveform will force the laser to mode hop at high frequency, essentially forcing the laser to have a stable multimode spectrum. This result is accomplished by driving the laser down to or slightly below threshold, forcing it out of lasing and then allowing it to re-establish lasing at a rate of millions of times per second. Because the spectral output is stable over time, the current from the photodiode is truly representative of the laser output power. A shift in current represents a drift in laser output power, not a hop in laser wavelength. The rate of intensity fluctuation will be greater than that which a back facet photodiode detects because of the photodiode's response characteristics. From the low frequency perspective of the photodiode and feedback circuit, the laser intensity is stable. Since the spectrum detected by the photodiode is stable, historical problems associated with using a back facet photodiode and control circuit as a means of stabilizing a laser will be solved. Only significant slow drifts in the laser output power, not wavelength, will be detected, and the control circuit will make appropriate adjustments to the current supplied to the semiconductor laser.

The added complexity and cost associated with thermoelectric cooling can be eliminated. Because radio frequency injection creates laser stability, it eliminates the need to have a thermoelectric cooler control the temperature of the laser. Any changes in the output wavelength of the laser will be very minor, and it is unnecessary to introduce the expense and complexity of a thermoelectric cooler to control the laser.

Laser noise associated with mode hop that may normally appear in an image can be shifted to higher frequencies where it is not noticeable by the human eye. The present invention uses a circuit to inject a high duty cycle radio frequency waveform to force the laser to a stable multimode spectral output. Any mode hopping that occur will be at the injected radio frequency. Increasing the mode hopping frequency of a laser shifts the noise spectrum of the laser such that the intensity noise is averaged within each pixel, thus making the noise less visible in images that are written with lasers.

The invention and its objects and advantages will become more apparent in the detailed description of the preferred embodiment presented below.

BRIEF DESCRIPTION OF THE DRAWINGS

FIG. 6b is a more detailed schematic of the control circuit shown in FIG. 6a;

DETAILED DESCRIPTION OF THE INVENTION

The present invention will be directed in particular to elements forming part of, or in cooperation more directly with, the apparatus in accordance with the present invention. It is understood that elements not specifically shown or described may take various forms well known to those skilled in the art.

Figure 1:
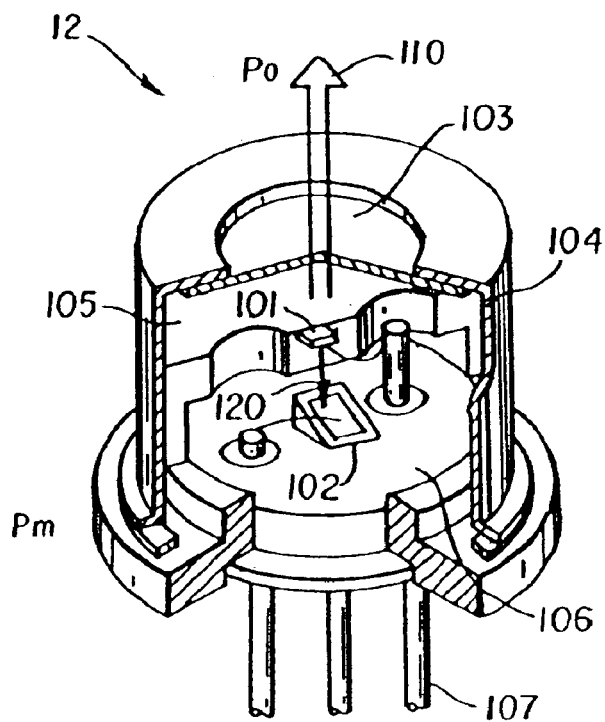
FIG. 1 is a partial cut away perspective view of a semiconductor laser.

FIG. 1 shows a semiconductor laser 12. Laser 12 is in a container defined by a cap 104 having an aperture 103 in a stem 106 and terminal 107. A semiconductor laser element 101 is mounted on a heatsink 105 with a light-emitting face on the side of aperture 103. A back facet photodiode 102 is fixed to stem 106 with a light receiving surface facing the semiconductor laser element 101. A laser beam 110 and a light power output ($P_o$) is emitted from the semiconductor laser element 110 through aperture 103. At the same time, a monitor beam 120 with a light power output ($P_m$), at usually about 3% of $P_o$, is emitted from the semiconductor laser element 101 toward the photodiode 102. The laser beam 110 is directed through writer optics, not shown.

Figure 2:
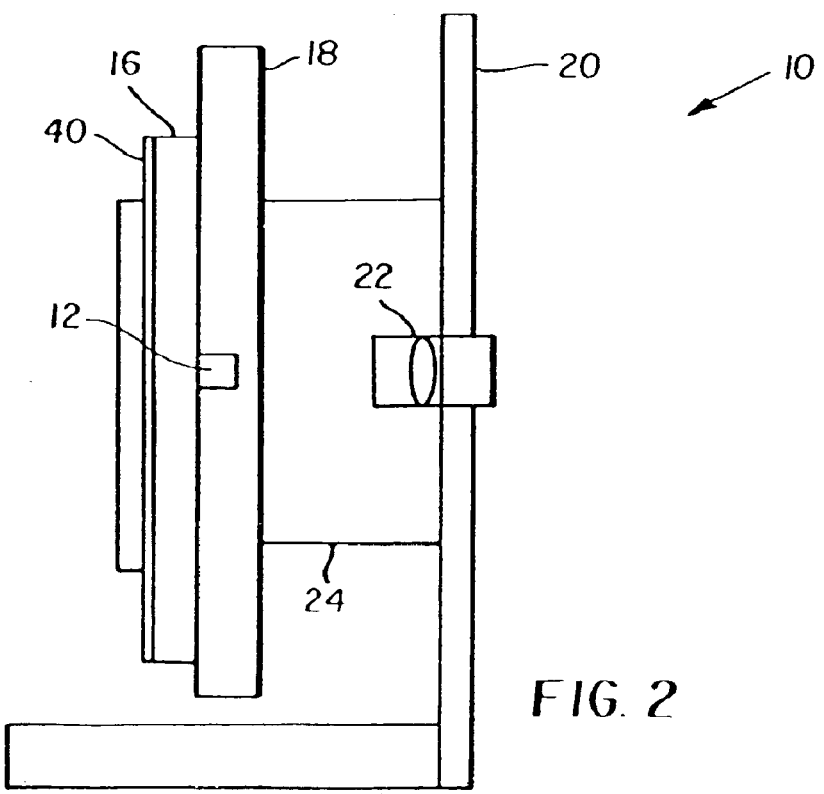
FIG. 2 is a schematic view of a radio frequency (RF) stabilized laser according to the present invention.

FIG. 2 shows a RF stabilized laser configuration 10. A laser diode 12 and laser drive assembly 40 are attached to an aluminum block 16 which is screwed to a heatsink plate 18. The heatsink plate 18 is attached to a collimator mount 24, which in turn is attached to mounting bracket 20. Collimator mount 24 also holds a collimator lens 22. The stabilized laser 10 is aligned to writer optics, not shown. In an alternate embodiment, the stabilized laser 10 is coupled to an optical fiber allowing the stabilized laser 10 to be mounted at a remote location.

Figure 3:
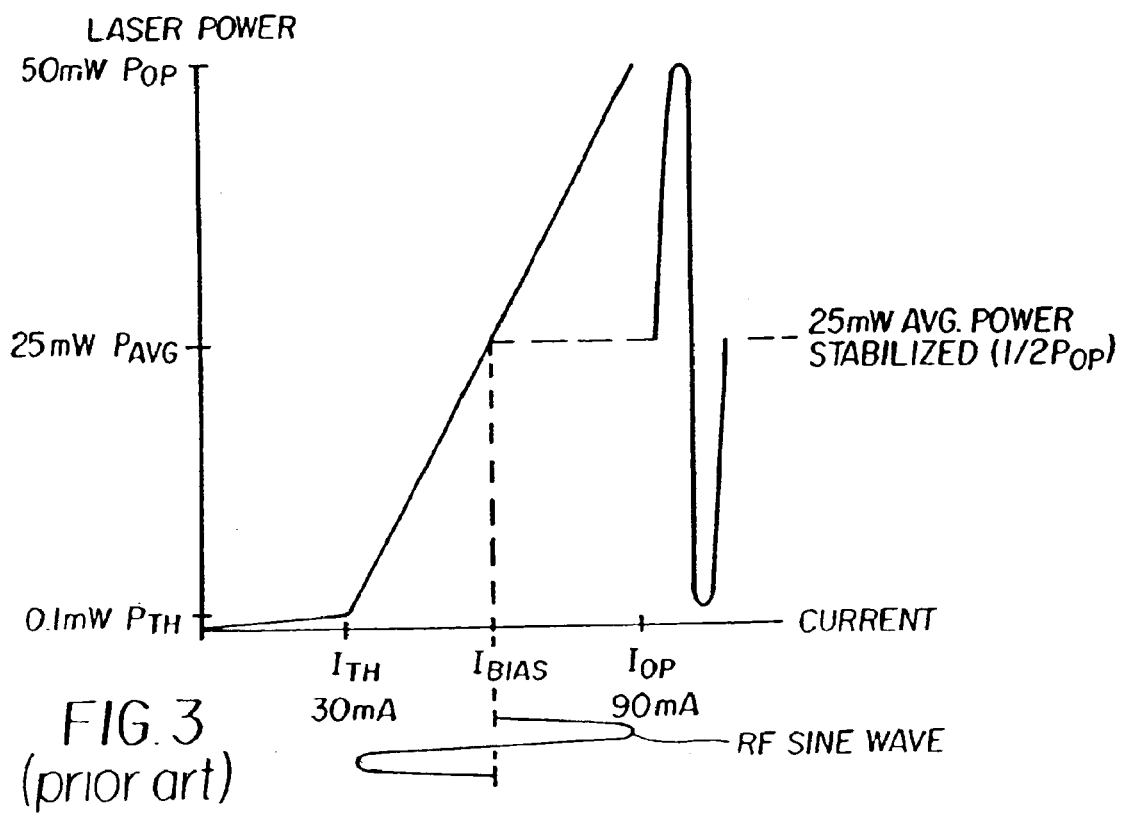
FIG. 3 is a graph of power versus input current for a stabilized semiconductor laser with a RF injected sine wave.

FIG. 3 shows a graph of power versus input current for a 50 mW Mitsubishi 1413 R01 semiconductor laser, with a threshold just above 30 mA and a maximum current of 90 mA. When the DC level is set to 60 mA, the laser provides 25 mW of output, which is half of the rated value. The AC signal, provided by a Colpitts RF oscillator, is added to the applied DC level to swing the laser current from 30 mA ($I_{th}$, laser threshold) to 90 mA ($I_{op}$, the maximum rated optical power out). Laser power $I_{op}$ is 50 mW for this laser and at $I_{th}$ it is approximately 0.1 mW optical power. The semiconductor laser is turned on to maximum power and essentially turned off during each cycle of the RF. The RF frequency is typically about 200 MHz for a writer system with a pixel clock of approximately 20 MHz, thereby turning the laser on and off about 10 times during each pixel. The sine wave generated by the Colpitts oscillator has a 50% duty cycle, because it is easy to generate but has little or no higher harmonic content. Only the fundamental 200 MHz signal is generated, making it easier to deliver the signal to the laser diode.

Figure 4:
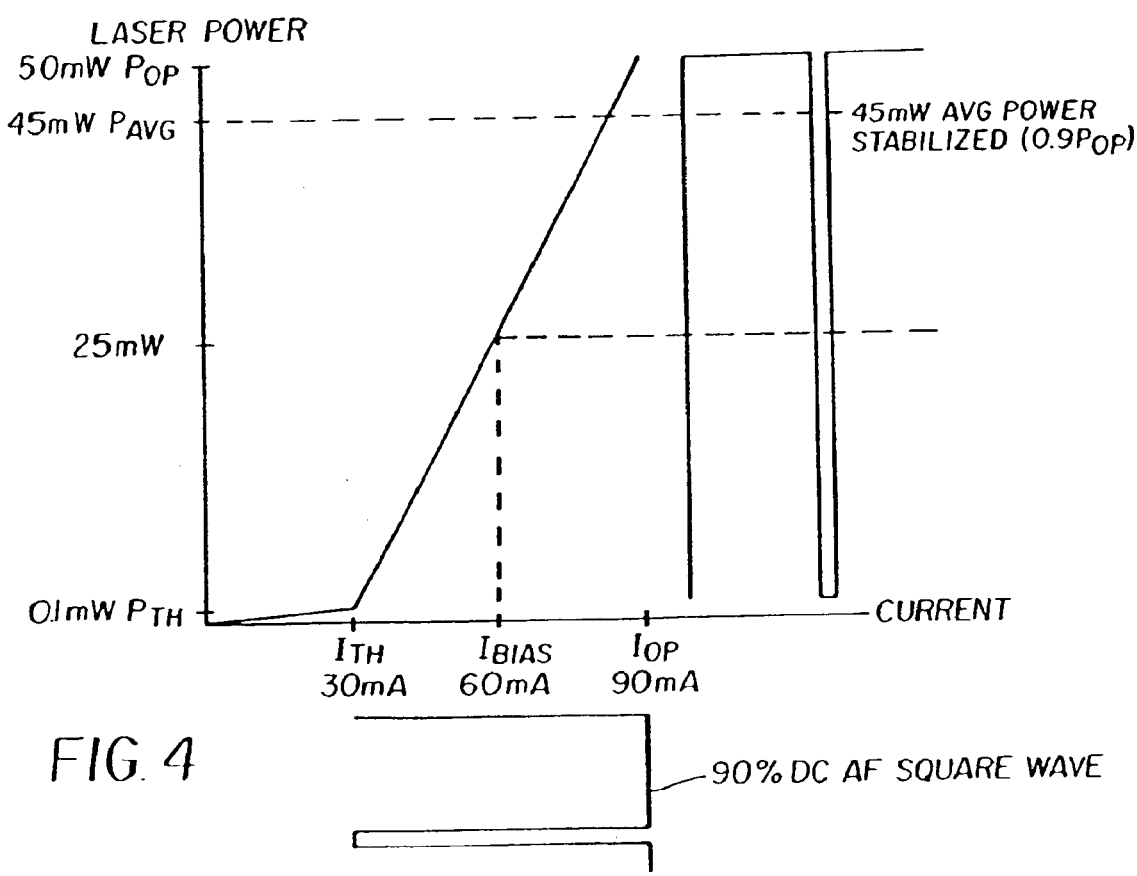
FIG. 4 is a graph of power versus input current for a stabilized semiconductor laser with a RF injected waveform having a 90% duty cycle.

FIG. 4 shows a graph of power versus input current with a 90% duty cycle waveform. When the duty cycle of the injection waveform is increased, the average power level of the stabilized power will be increased. For example, if the waveform has a duty cycle of 90%, then 45 mW out of a possible 50 mW would be stabilized output power.

Figure 5:
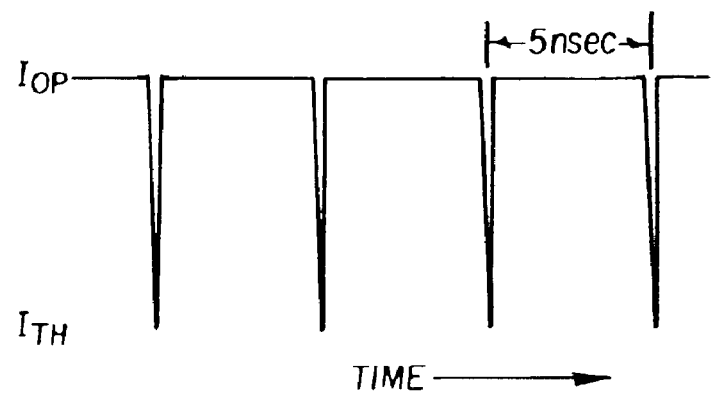
FIG. 5 is a graph of input current versus time for a stabilized semiconductor laser with a high duty cycle RF injected waveform.

FIG. 5 shows a waveform where the drive signal is predominantly at a high level, and only occasionally goes low in a very short duration spike. The spike must be low enough to take the laser below threshold and just long enough to disrupt lasing.

Figure 6A:
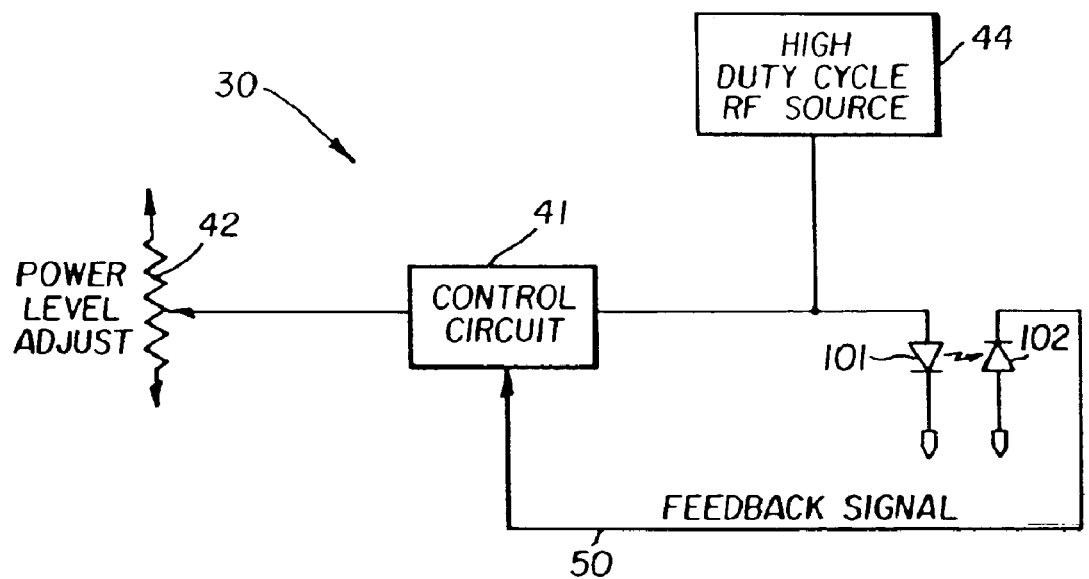
FIG. 6a is a schematic of a control circuit and RF injection circuit.

FIG. 6a shows a laser drive system 30, a power level adjust 42, and a control circuit 41 to provide constant laser power output by utilizing the feedback signal 50 from the photodiode 102. A high duty cycle RF source 44, commonly called an injection circuit, is injected into the semiconductor laser 101 to induce a stable multimode spectrum.

Figure 6B:
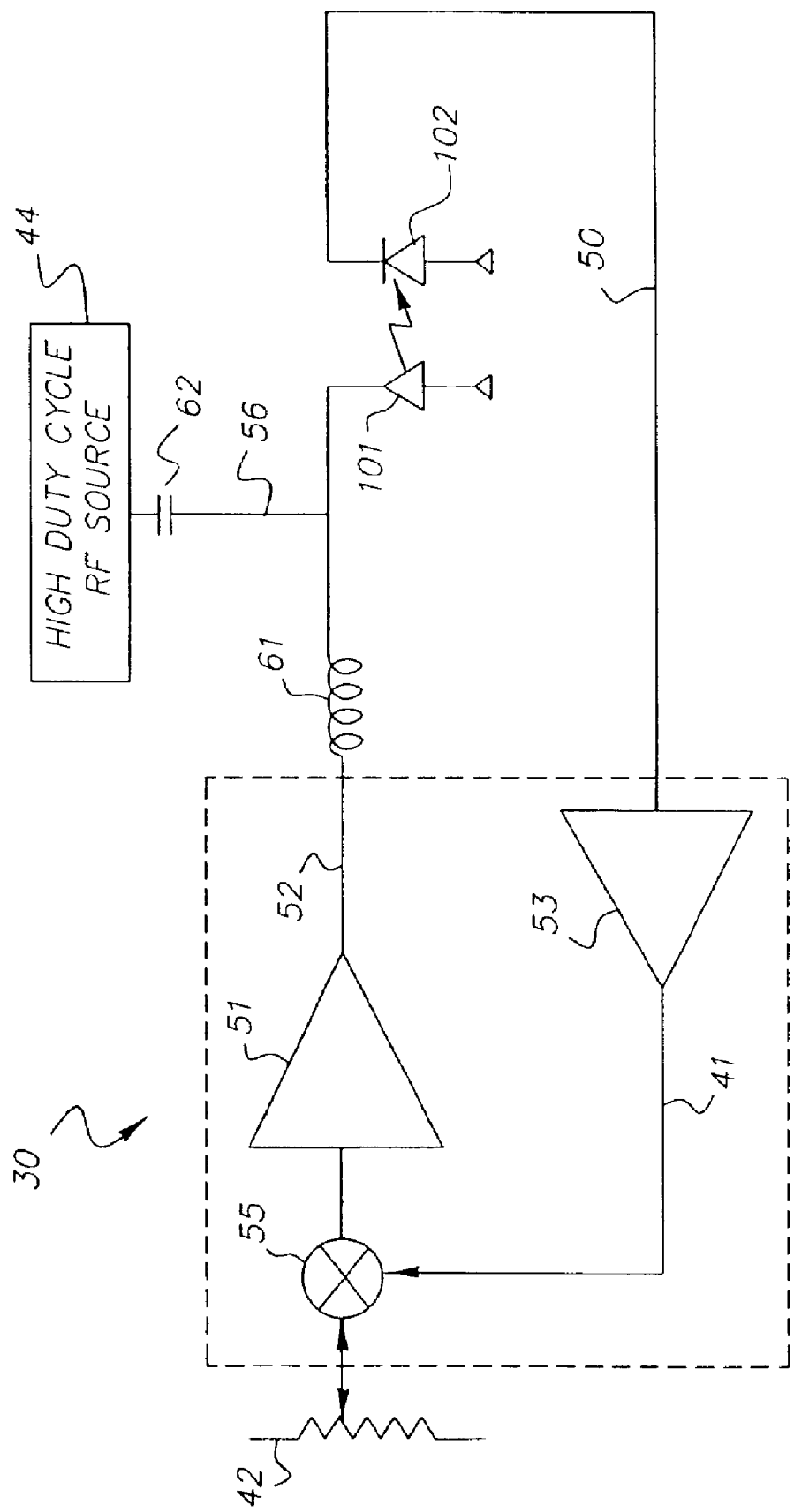

FIG. 6b shows the laser drive system 30 in more detail. It consists of a control system 41 with a power level adjust 42 and a high duty cycle RF source 44. The power level adjust 42 is used to set a nominal reference level to drive amplifier 51 to provide a nominal DC drive current 52 to the diode laser 101. The photodiode 102 senses the laser power output and generates a feedback signal 50 which is conditioned and amplified by amplifier 53 and sent to a summing junction 55. Amplifier 51 varies the DC drive current 52 to the laser 101 such that the feedback signal 50 from photodiode 102 will match the signal from the power level adjust 42 at the summing junction 55, a well known feature of this commonly used analog servo circuit. As the laser output varies with heat and aging, the variation in laser power is sensed by photodiode 102 and the drive current level 52 is automatically adjusted to keep the laser power constant. Because the laser wavelength can vary slowly or rapidly as a result of changes in temperature, drive current, laser aging effects and unwanted optical feedback, an erroneous signal can be generated by photodiode 102 causing undesirable fluctuations in laser output power.

To stabilize the wavelength spectra from the laser and thus avoid erroneous feedback signals from photodiode 102, an RF drive current 56 from the high duty cycle RF source 44 is combined with the DC drive current 52 and the combined current is sent to drive the diode laser 101. The DC current level, $I_{bias}$, is set to approximately the middle of the lasing range, halfway between $I_{th}$ and $I_{op}$. As shown previously in FIGS. 3 and 4, $I_{th}$ is 30 mA, $I_{op}$ is 90 mA, and $I_{bias}$ is approximately 60 mA. The RF level from RF source 44 is then adjusted such that the combined laser drive current now swings about the nominal DC level of 60 mA, down to or slightly below threshold at 30 mA and up to the maximum current $I_{op}$ at 90 mA. The output power of the laser is now flashing at the RF frequency rate, typically around several hundred megahertz, with the output power varying from 0.1 mW to 50 mW at the RF rate. The photodiode 102 is too slow to respond to such a high frequency and controls the power based on the DC level. Forcing the laser out of the lasing and back into lasing tends to bring the laser up sequentially into the few favored modes. The mode structure for each lasing event may not be the same, but combinations of the same five or six favored modes are selected. If, in writing one pixel, ten of these mode combinations occur, then the wavelength and power output will tend to average. Since the averaging is occurring during a pixel in the raster scan writing device, the power variation caused by mode hopping in the laser will not be seen. FIG. 3 represents prior art and shows an RF sinewave drive. A sinewave, by its very nature, has a 50% duty cycle. As shown in FIG. 3, the average stabilized power of the 50 mW laser is 25 mW, half of the rated power. FIG. 4 shows that if a 90% duty cycle squarewave is used, the stabilized output power can be raised to 45 mW. Increasing the laser output power simply by increasing the DC current or the RF current level will respectively result in shortening the life of the laser or destroying it by reverse biasing. Increasing the duty cycle will cause neither of these two deleterious effects, and it will increase the power output.

The inductor 61 allows the DC current to pass to the laser while blocking RF from getting to amplifier 51. The capacitor 62 allows the RF current to pass to the laser while blocking any DC current from getting to the RF source. The combination of the two is commonly known as a bias tee.

Figure 7A:
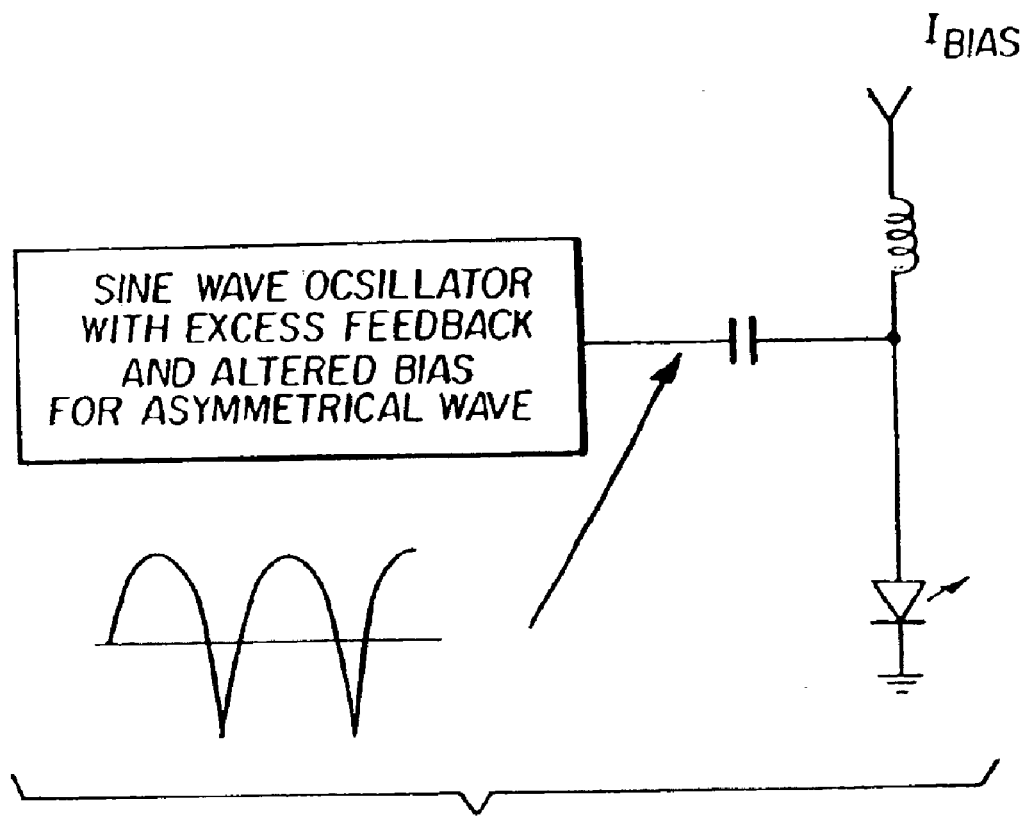
FIG. 7a is a schematic of a distorted sine wave oscillator circuit used to generate a high duty cycle RF waveform to be injected into a semiconductor laser.
Figure 7B:
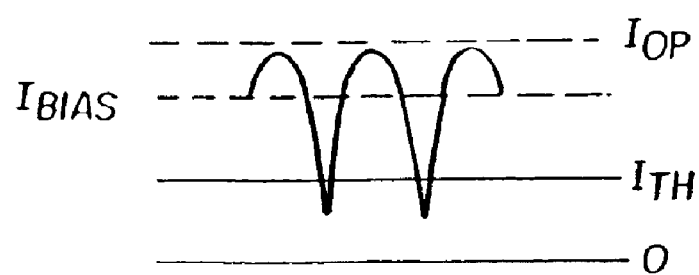
FIG. 7b is a graph of the semiconductor laser drive current showing laser operating current $I_{op}$ and lasing threshold current $I_{th}$.

FIG. 7a shows a schematic of a distorted sine wave oscillator circuit used to generate a high duty cycle RF waveform to be injected into a semiconductor laser. A sine wave oscillator with excess feedback and altered bias is used to create an asymmetrical sine wave. When injected into the semiconductor laser, the asymmetrical radio frequency sine waveform is capable of stabilizing the output spectrum of the laser and increasing the laser's output power. FIG. 7b is a graph of the semiconductor laser drive current showing laser operating current $I_{op}$ and lasing threshold current $I_{th}$. For example, if a 200 MHz RF distorted sine waveform is injected, the semiconductor laser is driven down to or slightly below threshold and forced to come back up into lasing at 200 million times a second. Based on the DC level, the RF is adjusted to drive the laser to operate at threshold or slightly below threshold. However, the drive current should stay above 0 mA. If the drive current is below zero, the laser could become back biased and be destroyed. Likewise, driving the laser above its rated $I_{op}$ can cause damage or reduce the lifetime of the laser. Moreover, the multimode operation of the semiconductor laser will transfer the intrinsic noise of said laser to higher frequencies, thus substantially reducing their visibility when such a laser is integrated into a laser raster system capable of writing images. Furthermore, the back facet photodiode, which is used in combination with the control circuit to monitor and control the output of the laser, is not responsive to the fast switching at the radio frequency. The back facet photodiode cannot detect the rapid changes in the output of the laser, and therefore continues to supply the same amount of current. Changes in laser output are therefore only detected within the response characteristics of the photodiode. Because the laser spectral output is stable over time, the current from the photodiode is truly representative of the laser output power. A shift in current now represents a drift in laser output power, not a hop in laser wavelength. Thus, the historical unreliability of back-facet photodiodes to control laser output power is remedied.

Figure 8A:
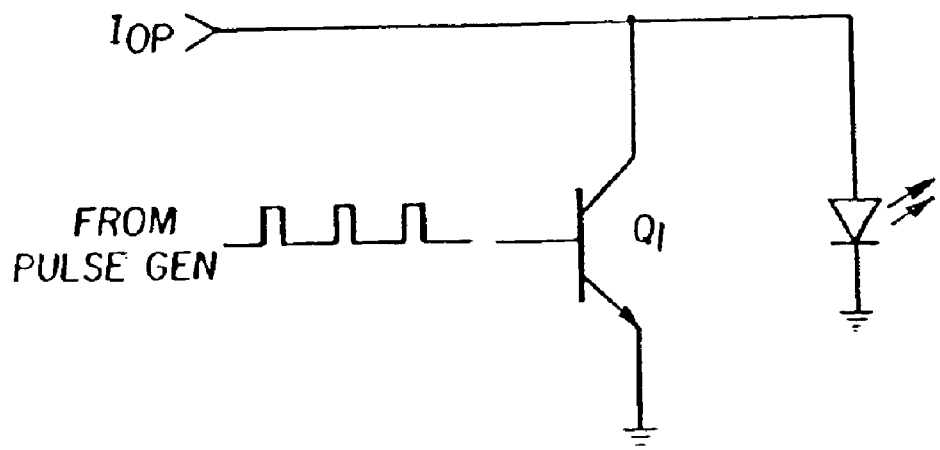
FIG. 8a is a schematic of a shunt modulator circuit used to generate a high duty cycle RF waveform used to generate a high duty cycle RF waveform to be injected into a semiconductor laser.
Figure 8B:
FIG. 8b is a graph of a pulsed input signal to the shunt modulator circuit.
Figure 8C:
FIG. 8c is a graph of the semiconductor laser drive current showing laser operating current $I_{op}$ and lasing threshold current $I_{th}$.

FIG. 8a is a schematic of a shunt modulator circuit used to generate a high duty cycle RF waveform to be injected into a semiconductor laser. The shunt modulator circuit is comprised of a DC current source and an active device. The active device in FIG. 8a is a single NPN bipolar transistor. However, other active components could be combined to produce the same effect in the shunt modulator circuit. The DC current is momentarily shunted by an active device connected in parallel with the ground or a suitable alternate load for a brief period of time. FIG. 8b is a graph of the semiconductor laser drive current showing laser operating current $I_{op}$ and lasing threshold current $I_{th}$. When the pulsed input of the active device briefly shunts the current from the semiconductor laser, the laser operates at or below lasing threshold. While the current is not being shunted, the semiconductor laser operates above lasing threshold. Frequent switching between operation near lasing threshold and above lasing threshold will induce multimode operation in the laser. Adjusting the pulsed input signal to the active element of the circuit will affect the duration that the laser is lasing above threshold, and a stable laser with a high power will result. In addition, the multimode operation of the semiconductor laser will transfer the intrinsic noise of said laser to higher frequencies, thus substantially reducing their visibility when such a laser is integrated into a laser raster system capable of writing image. Furthermore, the back facet photodiode, which is used in combination with the control circuit to monitor and control the output of the laser, is not responsive enough to the fast switching. The back facet photodiode cannot detect the changes in the output of the laser caused by the high frequency RF injection, and therefore continues to supply the same amount of current. Changes in laser output are therefore only detected within the response characteristics of the photodiode. Because the laser spectral output is stable over time, the current from the photodiode is truly representative of the laser output power. A shift in current now represents a drift in laser output power, not a hop in laser wavelength. Thus, the historical unreliability of back-facet photodiodes to control laser output power is remedied.

Figure 9A:
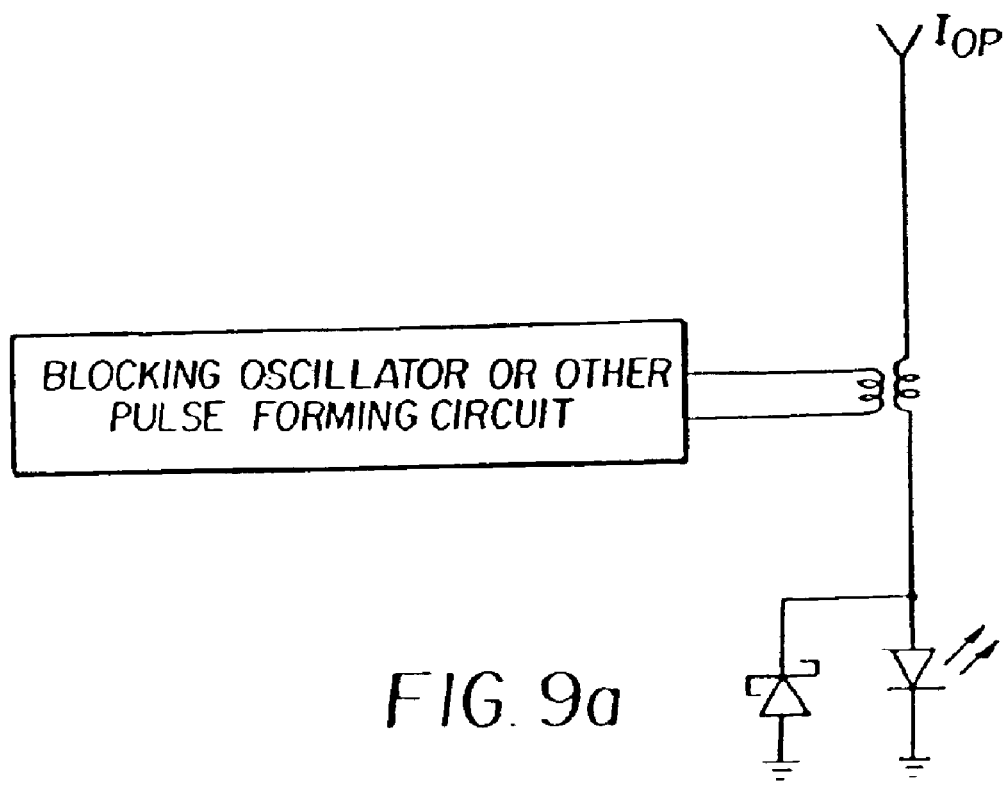
FIG. 9a is a schematic of a fast pulse network modulator circuit used to generate a high duty cycle RF waveform to be injected into a semiconductor laser.
Figure 9B:
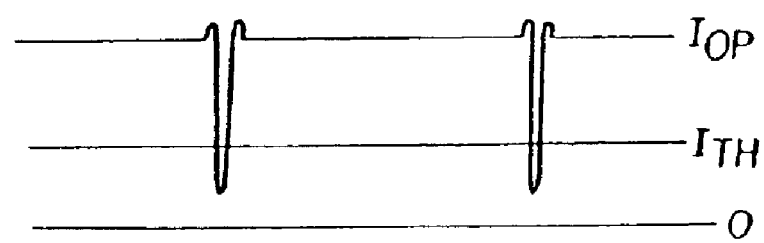
FIG. 9b is a graph of the semiconductor laser drive current showing laser operating current $I_{op}$ and lasing threshold current $I_{th}$.

FIG. 9a is a schematic of a fast pulse network modulator circuit used to generate a high duty cycle RF waveform to be injected into a semiconductor laser. The circuit consists of a DC current source, a transformer, and a diode wherein said diode is "fast clamping" and sensitive to large pulses that occur rapidly over time. A fast pulse generator, such as a blocking oscillator, is used to create narrow pulses that are superimposed onto the DC drive current to the semiconductor laser. Additional control circuitry is required to control the pulses, as well as to prevent reverse polarity on the semiconductor laser. FIG. 9b is a graph of the semiconductor laser drive current showing laser operating current $I_{op}$ and lasing threshold current $I_{th}$. The graph shows that the laser current drive signal will allow the laser to operate above threshold, and operates near threshold for short periods. Frequent switching between operation near lasing threshold and above lasing threshold will induce multimode operation in the laser. Adjusting the pulsed input signal to the active element of the circuit will affect the duration that the laser is lasing above threshold, and a stable laser with a high power output will result. In addition, the multimode operation of the semiconductor laser will transfer the intrinsic noise of the laser to higher frequencies, thus substantially reducing their visibility when such a laser is integrated into a laser raster system capable of writing images. Furthermore, the back facet photodiode, which is used in combination with the control circuit to monitor and control the output of the laser, is not responsive to the fast switching. The back facet photodiode cannot detect the changes in the output of the laser, and therefore continues to supply the same amount of current. Changes in laser output are therefore only detected within the response characteristics of the photodiode. Thus, the historical unreliability of back-facet photodiodes to control laser output power is remedied.

Single longitudinal mode operation is the quietest method of laser operation. However, it is difficult to keep the laser from mode hopping for long periods of time. Driving the laser to multiple longitudinal mode operation with RF injection is the next quietest method of operation. In noise level tests on a semiconductor laser, it is believed that the laser is not necessarily operating multimode at any instant it is turned on. Rather, operating the laser at or slightly below lasing threshold allows it to resume lasing in any of the approximately 4 or 5 likely longitudinal modes. Cycling between near threshold and lasing many times during the writing of one pixel allows an averaging effect to take place. The RF frequency should be several times the pixel clock frequency or pixel rate, with 10 times being a reasonable value. Thus, if all mode possibilities are not of the same intensity, the exposure from the average of ten samples should not vary significantly. The noise is not completely eliminated, but it is effectively confined to each written pixel, and does not show up as light and dark spots in an image. In addition, driving the laser to essentially multimode operation yields a stable output, which eliminates the cost and complexity of laser output control by thermoelectric cooling.

Thus, it is seen that a stabilized laser according to the present invention using radio frequency signal injection is able to produce high power output, produce a stable output spectrum that eliminates the need for thermoelectric cooling, and confine the inherent laser noise within each pixel of an image.

The invention has been described in detail with particular reference to certain preferred embodiments thereof, but it will be understood that variations and modifications can be effected within the scope of the invention.

PARTS LIST

10. Laser configuration
12. Semiconductor laser

16. Aluminum block
18. Heatsink plate
20. Mounting bracket
22. Collimator lens
24. Collimator mount
30. Laser drive system
40. Laser drive assembly
41. Control circuit
42. Power level adjust
44. High duty cycle RF source
50. Feedback signal
51. Amplifier
52. DC drive current
53. Amplifier
55. Summing junction
56 RF drive current (high duty cycle RF waveform)
61. Inductor
62. Capacitor
101. Semiconductor laser element
102. Photodiode
103. Aperture
104. Cap
105. Heatsink
106. Stem
107. Terminal
110. Laser element
120. Monitor beam

What is claimed is:

1. A system for stabilizing laser output levels comprising:
   a laser;
   a control circuit connected to said laser for providing drive current to said laser;
   an injection circuit connected to an output of said control circuit for injecting a high duty cycle radio frequency waveform into said drive current;
   a back facet photodiode sensor for detecting radiation from a back facet of said laser and for providing a feedback signal to said control circuit for maintaining a power level of said laser constant;
   wherein said radio frequency waveform causes said drive current to oscillate above and below a DC bias point between a lasing threshold level and an asymmetrical level above the DC bias point; and
   wherein said injection circuit injects said radio frequency waveform into said drive current with a duty cycle greater than 50%.

2. A system as in claim 1, wherein said back facet photodiode and said control circuit respond to significant drifts in laser output power.

3. A system as in claim 1, wherein said high duty cycle radio frequency waveform creates a stable output spectrum from said laser.

4. A system as in claim 1, wherein said high duty cycle radio frequency waveform injected into said laser confines inherent laser noise within each pixel of an image.

5. A system as in claim 1, wherein a thermoelectric cooler is affixed to said laser and a controller for said thermoelectric cooler controls a temperature of said thermoelectric cooler such that said laser has additional output stability.

6. A system as in claim 1, wherein said injection circuit is comprised of:
   a sine wave oscillator with excess feedback and altered bias to generate an asymmetrical waveform;
   a capacitor, wherein said asymmetrical waveform is directed through said capacitor;
   a direct current source; and
   an inductor, wherein said DC current source is directed through said inductor and drives said laser.

7. A system as in claim 1, wherein said injection circuit is comprised of:
   a direct current source capable of providing current;
   a signal generator capable of generating a pulsed waveform; and
   an active electrical component, wherein said component is capable of shunting said current away from said laser when driven by said pulsed waveform.

8. A system as in claim 1 wherein said injection circuit is comprised of:
   a pulse forming circuit;
   a direct current source capable of producing current;
   a transformer, wherein said transformer is connected to said pulse forming circuit and direct current source; and
   a fast clamping diode, wherein said diode shunts said current away from said laser.

9. A system as in claim 1 wherein said radio frequency is at least twice the pixel clock frequency.

10. A method of stabilizing laser output levels comprising the steps of:
    forming front and back facets on a laser element of a laser;
    injecting said laser with current and a radio frequency signal, wherein said radio frequency signal is a high duty cycle waveform; and
    inducing multimode operation of said laser.

11. A method as in claim 10, wherein said duty cycle is greater than 50%.

12. A method as in claim 10, wherein said multimode operation of said laser confines inherent laser noise within each pixel of an image.

13. A method as in claim 10, wherein said radio frequency signal with said high duty cycle waveform is generated by a sine wave oscillator with excess feedback and altered bias.

14. A method as in claim 10, wherein said radio frequency signal with said high duty cycle waveform is generated by inputting a pulsed waveform into an active electrical component to shunt said current away from said laser.

15. A method as in claim 10, wherein said radio frequency signal with said high duty cycle waveform is generated by a pulse forming circuit connected to a transformer and a fast clamping diode, wherein said current is shunted away from said laser.

16. A method for stabilizing laser output levels comprising:
    providing a drive current to a laser;
    injecting a high duty cycle radio frequency waveform into said drive current;
    detecting radiation from a back facet of said laser;
    comparing said back facet radiation to a nominal reference level;
    providing a feedback signal based on said comparison for maintaining a power level of said laser constant;
    wherein said radio frequency waveform causes said drive current to oscillate above and below a DC bias point between a lasing threshold level and an asymmetrical level above the DC bias point; and
    wherein an injection circuit injects said radio frequency waveform into said drive current with a duty cycle greater than 50%.

* * * * *